United States Patent [19]

Papathomas et al.

[11] Patent Number: 5,194,930
[45] Date of Patent: Mar. 16, 1993

[54] DIELECTRIC COMPOSITION AND SOLDER INTERCONNECTION STRUCTURE FOR ITS USE

[75] Inventors: Kostas Papathomas, Endicott; Mark D. Poliks; David W. Wang, both of Vestal; Frederick R. Christie, Endicott, all of N.Y.

[73] Assignee: International Business Machines, Armonk, N.Y.

[21] Appl. No.: 760,654

[22] Filed: Sep. 16, 1991

[51] Int. Cl.$^5$ ............................... H01L 29/167
[52] U.S. Cl. ................................ 257/773; 257/779
[58] Field of Search ....................... 357/65, 66, 68

[56] References Cited

U.S. PATENT DOCUMENTS

| | | | |
|---|---|---|---|
| 3,281,491 | 10/1966 | Smith et al. | 260/830 |
| 3,849,187 | 11/1974 | Fetscher et al. | 117/201 |
| 4,604,644 | 8/1986 | Beckham et al. | 357/80 |
| 4,698,402 | 10/1987 | Kordomenos et al. | 525/533 |
| 4,710,796 | 12/1987 | Ikeya et al. | 357/72 |
| 4,736,012 | 4/1988 | Shoji et al. | 528/188 |
| 4,769,425 | 9/1988 | Dervan et al. | 525/528 |
| 4,892,894 | 1/1990 | Koleske | 522/31 |
| 4,999,699 | 3/1991 | Christie | 337/65 |
| 5,043,221 | 8/1992 | Koleske | 428/413 |

Primary Examiner—Paul M. Dzierzynski
Assistant Examiner—R. A. Ratliff
Attorney, Agent, or Firm—Judith D. Olsen; Richard M. Goldman

[57] ABSTRACT

Composition and solder interconnection structure for its use, wherein the gap created by solder connections between a carrier substrate and a semiconductor chip device mounted thereon is filled with the solvent free formulation obtained by curing a preparation containing a cycloaliphatic polyepoxide and/or curable cyanate ester or prepolymer thereof, polyol, and filler which is substantially free of alpha particle emissions.

8 Claims, 2 Drawing Sheets

5,194,930

DIELECTRIC COMPOSITION AND SOLDER INTERCONNECTION STRUCTURE FOR ITS USE

BACKGROUND OF THE INVENTION

1. Field of the Invention

The present invention is concerned with interconnection structures for joining an integrated semiconductor device to a carrier substrate, and particularly to a structure for forming solder interconnection joints that exhibit improved fatigue life, stability and integrity. The present invention is especially concerned with the so-called "controlled collapse chip connection", a/k/a "C4" technology, a/k/a/ face-down or flip-chip bonding in which solder interconnections are employed. The present invention is further concerned with a method of making the interconnection structure.

REFERENCE TO COPENDING APPLICATION

Reference is made herein to copending application Ser. No. 07/624,973, filed Dec. 10, 1990, entitled "Solder Interconnection Structure and Process For Making", which is a divisional application of U.S. Pat. No. 4,999,699, (Ser. No. 07/493,126) issued Mar. 12, 1991, both incorporated herein by reference and both assigned to the assignee of the present application, over which the present invention is considered an improvement due to the improved crack resistance, and of which is a Continuation-in-Part. All claims to the present application are directed to the improvement.

2. Background Art

The field of the present invention has been in existence for over twenty years and the technology has been proposed for use in interconnecting high density I/O (input/output) and area array solder bumps (balls) on semiconductor chips, for example silicon chips, to the base carrier, for example to an alumina carrier. The solder bump, typically a 95%Pb/5%Sn alloy, provides the means for chip attachment to the carrier. For example, see Miller U.S. Pat. Nos. 3,401,126 and 3,429,040, assigned to the assignee of the present invention, for a further discussion of the controlled collapse chip connection (C4) technique of face-down bonding of semiconductor chips to a carrier. Typically a malleable pad of metallic solder is formed on the semiconductor device contact site, and solder joinable sites are formed on the conductors on the chip carrier, which may be comprised of alumina, ceramic, flexible organic film, multi-level circuit board, and the like. Likewise, the mounted device may be comprised of any of the the aforementioned materials and is not limited to semiconductor chips.

The device carrier solder joinable sites are surrounded by material which is nonwettable by solder and acts as a barrier, so that when the solder melts, surface tension of the molten solder prevents collapse of the joints, which continue to hold the chip suspended above the carrier.

As the technology requires ever greater circuit density, the sizes of individual active and passive elements of the chip circuitry have become very small and the number of elements has increased dramatically. This trend will continue and will place increasingly higher demands on the properties of materials and on the techniques by which the structures are formed. Solder joining a chip and a carrier is consistent with the demand for improved technological efficiency in that it provides that the I/O terminals can be distributed over substantially the entire top surface of the device, a technique known as area bonding.

It is suggested that the present invention would also be useful for other instances of joining materials having differences in thermal expansion coefficient (CTE), and in the field of surface mounted devices even when standoffs other than solder balls or bumps are used. It is also suggested that the present invention would be useful in "glob top" applications, wherein a mounted device and carrier are covered by a protective or heat transferring dielectric formulation.

It is usually the case that the integrated circuit semiconductor chip device and the carrier on which it is mounted are comprised of materials having coefficients of thermal expansion (CTEs) which differ from one another. For example, the chip device may be formed of monocrystalline silicon, which has a CTE of $2.6 \times 10^{-6}$ per degree C, and the carrier may be formed of a ceramic material such as alumina which has a CTE of $6.8 \times 10^{-6}$ per degree C. In operation, the elements of the integrated semiconductor chip device generate heat, which is carried through the solder connections to the carrier, resulting in temperature fluctuations and discrepancies in the amounts of expansion and contraction among the varying materials due to the varying CTE values. The temperature cycling process results in stress to the solder joints. The greater the temperature fluctuation, the farther the solder joint from the center of the chip, and the greater the differences in the respective CTEs, the greater the stress on the solder joints. Conversely, the larger the distance between the carrier and the semiconductor chip surface mounted thereon, the lower the stress on the solder joints therebetween. However, as the solder joints become smaller in diameter in order to accommodate the demand for increased density, the height of the solder joint decreases along with the distance between the carrier and chip, increasing the stresses.

An improved solder interconnection structure, having increased fatigue life has been disclosed by Beckham in U.S. Pat. No. 4,604,644 assigned to the assignee of the present invention, disclosure of which is incorporated h by reference. U.S. Pat. No. 4,604,644 discloses a structure for electrically joining a semiconductor device (chip) to a support structure (carrier) which has a plurality of solder connections, each solder connection joining a solder wettable pad on the device and a corresponding solder wettable pad on the supporting substrate, with dielectric material disposed between the peripheral area of the device and the facing area of the substate, which material surrounds at least one outer row and column of solder connections but leaves the solder connections in the central area free of the dielectric material.

The preferred dielectric material disclosed in U.S. Pat. No. 4,604,644 is obtained from a polyimide resin obtainable commercially and sold under the trademark AI-10 by Amoco Corporation. AI-10 is formed by reacting a diamine such as p,p'diaminodiphenylmethane with trimellitic anhydride or acylchloride of trimellitic anhydride. The polymer is further reacted with gamma amino propyl triethoxy silane (A1100) or Beta-(3,4-epoxy cyclohexyl) ethyltrimethoxy silane (A186) from Dow Corning. The coating material is described in IBM Technical Disclosure Bulletin, Sept. 1970, P.825. The dielectric material is typically applied by first mixing it with a suitable solvent and then dispensing it along the periphery between the chip device and the carrier and permitting it to fill the area between the chip and carrier by capillary action.

U.S. Pat. No. 4,999,699 issued Mar. 12, 1991 to Christie et al. and commonly assigned with the present invention and the divisional case, Ser. No. 07/493,126, discloses improvement to the flow of the dielectric to completely surround each of the C4 solder ball connections and cover heads of any contact pins. The Christie et al. patent discloses a curable composition containing a binder which is a cycloaliphatic polyepoxide and/or a cyanate ester or prepolymer thereof and a filler. The cycloaliphatic polyepoxide, cyanate ester and cyanate ester prepolymer possess viscosities of no more than about 1,000 centipoise at normal room temperature (about 25 degrees C). The filler has a maximum particle size of 31 microns and is substantially free of alpha particle radiation. The amount of binder (i.e. epoxy and/or cyanate ester) is about 25 to about 60 % by weight of the total weight of the binder plus filler and, correspondingly, the filler is about 40 to about 75% by weight of the total weight of the binder plus the filler. The formulation includes, in addition, surfactant and reactive modifier, a/k/a flexibilzer. The Christie et al. formulation is the only one known to the resent inventors both to adequately flow under the chip in the 5 mil or narrower gap between chip and carrier as well as to cover completely the pin heads. The improved formulation of the present invention extends the advantage further to ensure that there are no cracks developed in the cured formulation after repeated aggressive temperature cycling.

Copending application Ser. No. 07/745,760 (EN991-021) filed by inventors Papathomas, Christie and Wang and commonly assigned with the present invention is also concerned with C4 dielectric encapsulant. However, the dielectric encapsulant with which it is concerned is a high-temperature encapsulant comprised of a different resin system from that of the present invention.

Known C4 encapsulant material is typically applied by first mixing it with a suitable solvent and then dispensing it. The formulation of the present invention is free of added solvent and consists of components which are reactive and are incorporated in the final cured composition. The absence of solvent avoids thickness and coverage reduction and also present folds from getting entrapped under the chip due to solvent evaporation in the solvent based systems.

Although the earlier disclosed techniques and compositions have enjoyed success, there still remains room for improvement, especially in the ability of the dielectric encapsulant to avoid crack formulation upon aggressive thermocycling, especially within the temperature range of about −40 to about +60 degrees C.

SUMMARY OF THE INVENTION

Accordingly, it is an object of the invention to provide a crack resistant C4 dielectric encapsulant composition/formulation.

It is a further object of the invention to provide a composition, suitable for use as a C4 encapsulant dielectric material, which is solvent free and comprised 100% of low viscosity-filled liquid thermosetting components and which is free of damaging radioactive isotopes.

Still another object of the invention is to thoroughly encapsulate contact pin heads and C4 solder joints in a flip-chip structure, even when the gap between the chip and carrier is less than 5 mils.

The foregoing and other objects and advantages are accomplished in the present invention by means of a curable resin formulation comprising a binder including about 70 to about 95 by weight of a cycloaliphatic diepoxide, for example 3,4 epoxycyclohexylmethyl-3,4-epoxy-cyclohexane carboxylate (such as ERL-4221 marketed by Union Carbide) in combination with about 5% to about 30% by weight of polyol, preferably a polyol such as polyether polyol, having a molecular weight between about 700 and 6,000 (such as LHT-240, LHT-42 and LHT 28 from Union Carbide) and preferably comprising about 10% by weight of the binder. It has been found that the addition of polyol in the range recited surprisingly improves the toughness of the base resin and thereby provides a composition which resists cracking/fracture upon repeated thermal cycling between about −40 degrees C and about +60 degrees C. Polyols in the range of molecular weight and weight percents recited give phase separated systems, resulting in the increase of fracture toughness of the cured resin composite in which they are included. The resin is cured using equal parts of hexahydrophthalic anhydride (HHPA) commercially available from Hulls America and one part of benzyl dimethyl amine (BDMA) as the catalyst from Aldrich Chemical Company Inc. Ethylene glycol was incorporated as a source of active hydrogen. Surfactant in the range of about 1–1.4% by weight was also included in the formulation subsequent to the addition of about 58% by weight of filler. The filler is ultraclean and free of the alpha particle emissions which are produced from radioactive isotopes of uranium and thorium normally present in naturally occurring fillers. In order to provide the appropriate viscosity and CTE control in a gap space of less than 5 mils, the filler particle size in the C4 encapsulant formulation should be about 0.5 to about 50 microns. A coupling agent is provided to couple the filler to the binder matrix and prevent the absorption of moisture into the filler, which would degrade the electrical properties of the material.

The solder electrical interconnections which extend between an integrated semiconductor chip device and a carrier substrate are positioned in the narrow gap between the parallel planes of the chip and carrier. The gap is filled completely with the composition of the invention, which is then cured to form a material which increases the fatigue life of the structure which remains crack-free after repeated, aggressive thermal cycling.

BRIEF DESCRIPTION OF THE PREFERRED EMBODIMENT

In order to facilitate understanding of the present invention, reference is made to the following detailed description taken in conjunction with the above described drawings.

Figure 1:
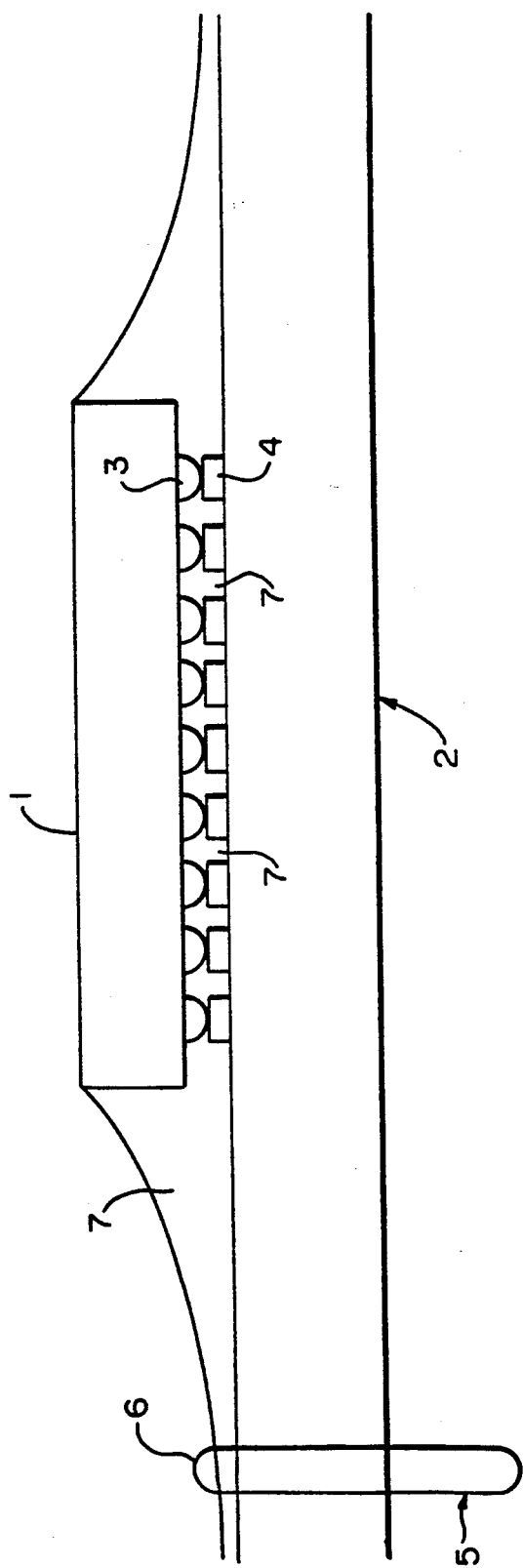
FIG. 1 is a schematic drawing of a chip mounted on a carrier using encapsulated C4 solder joints.

In FIG. 1, numeral 1 represents a semiconductor chip joined to the chip carrier 2 by solder bumps 3 mated to pads 4. I/O pins 5 extend and protrude from the carrier 2, with a small portion 6 of the pins protruding from the other side of the carrier 2 for carrying current thereto. When the carrier is an organic substrate, the pins 6 as such are not required. Instead, electrically conductive circuitry and interconnections would be provided, for instance at the periphery of the substrate, for connection to a desired structure. The encapsulant 7 provides pursuant to the present invention an essentially void free, crack resistant encapsulation of the solder joint connections, thereby assuring a highly reliable device which fills the gap between the chip and the carrier, forming a uniform fillet around the chip as well as completely surrounding the solder joints and pin heads (not shown) while remaining crack free through thermal cycling.

As described earlier, FIG. 2 is an SEM of structure which includes the filled encapsulant in the gap between the chip and carrier. Arrows in FIG. 2 indicate cracks which have developed as a result of 10 cycles between about −40 degrees C and 60 degrees C.

Figure 2:
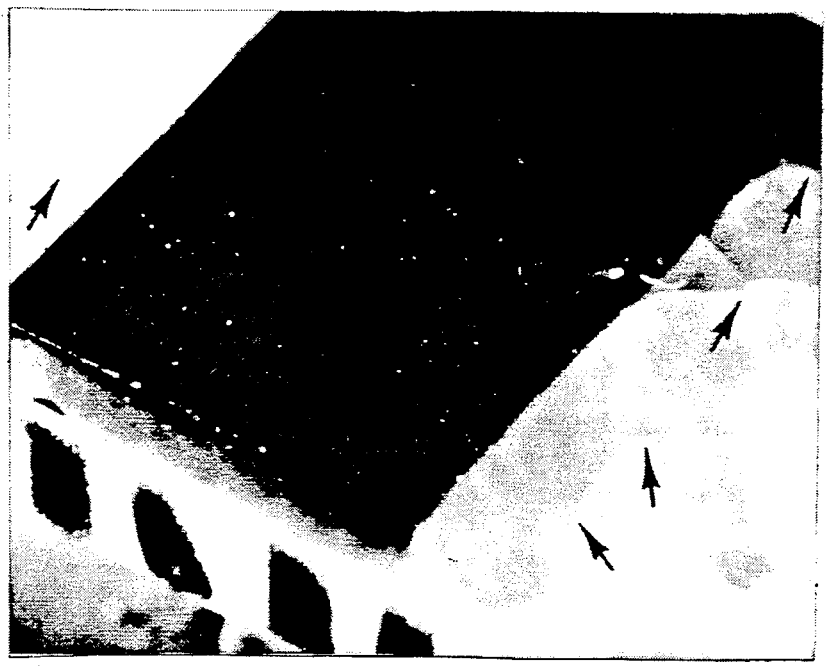
FIG. 2 is a scanning electron micrograph (SEM) of a chip mounted on a carrier using C4 solder joints encapsulated with filled encapsulant, not the improved composition of the present invention, subsequent to thermal cycling. Arrows in FIG. 2 indicate that cracks have formed in the encapsulant after 10 cycles between about −40 and about degrees C.
Figure 3:
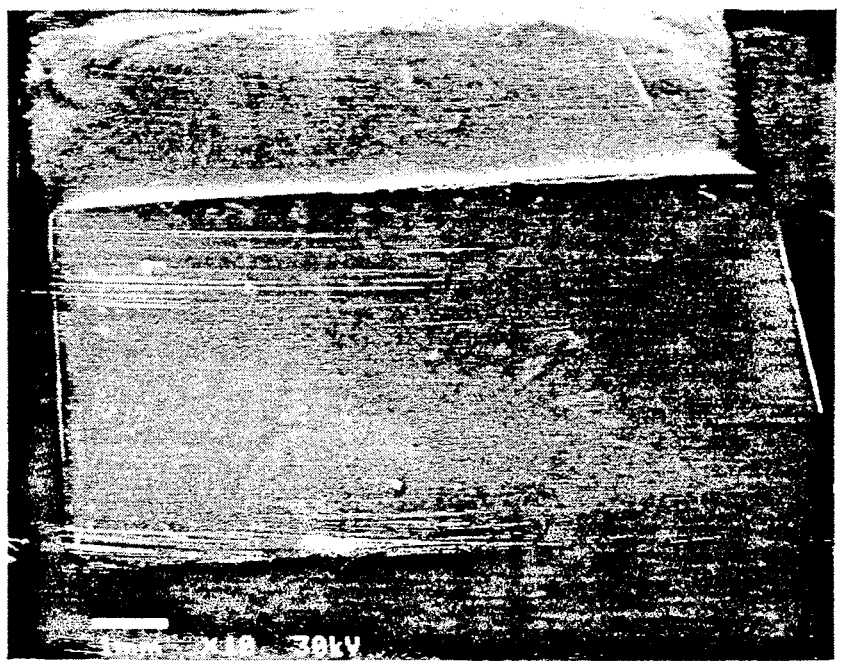
FIG. 3 is an SEM of a chip mounted on a carrier using C4 solder joints encapsulated with the improved composition of the present invention, subsequent to the same thermal cycling seen in FIG. 2 described above. No cracks have formed.

In contrast to FIG. 2, the SEM of FIG. 3 of different magnification shows no cracks after the same thermal cycling as seen by the FIG. 2 device. The difference is that FIG. 3 includes in the gap between chip and carrier the improved formulation containing the flexible polyol in the concentration range of the invention, which is about 5% to about 25% by weight binder, preferably about 10%, and 58% by weight fused silica filler. The alpha particle emission of the 49 micron size particle fused silica filler was measured using a scintillation counter and is less than 0.005 counts/cm2-hr. The filler used is identified as DP4910 from PQ Corporation.

The encapsulant composition of the present invention must contain a binder selected from the group of cycloaliphatic polyepoxide, cyanate ester, prepolymer of cyanate ester or mixtures thereof.

The cycloaliphatic type epoxides employed as the preferred resin ingredient in the invention are selected from non-glycidyl ether epoxides containing more than one 1,2 epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides or ketones to give the compound R—COOOH. These materials are well known in the art and reference may be made to Brydson, J., *Plastic Materials*, 1966, 471, for their synthesis and description.

Such non-glycidyl ether cycloaliphatic epoxides are characterized by having a ring structure wherein the epoxide group may be part of the ring or may be attached to the ring structure. These epoxides may also contain ester linkages. The ester linkages are generally not near the epoxide group and are relatively inert to reactions.

Examples of non-glycidyl ether cycloaliphatic epoxides would include 3,4-epoxycyclohexylmethyl-3,4-epoxycyclohexane carboxylate (containing two epoxide groups which are part of the ring structures, and an ester linkage); vinylcyclohexane dioxide (containing two epoxide groups, one of which is part of a ring structure); 3,4-epoxy-6-methyl cyclohexyl methyl -3,4-epoxycyclohexane carboxylate and dicyclopenta diene dioxide, having the following respective structures:

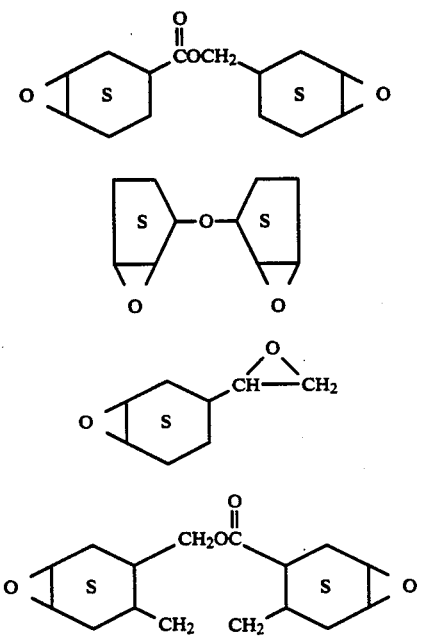

A distinguishing feature of many of the cycloaliphatic epoxides is the location of the epoxy group(s) on a ring structure rather than on an aliphatic side chain. Generally, the cycloaliphatic epoxide particularly useful in this invention will have the formula selected from the group consisting of:

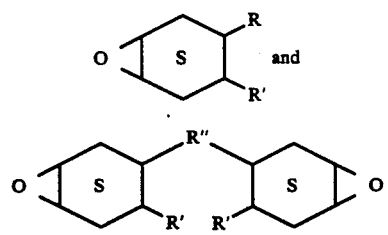

where S stands for a saturated ring structure, R is selected from the group of consisting of CHOCH2, O(CH2)nCHOCH2 and OC(CH3)2CHOCH2 radicals where n=1 to 5, R' is selected from the group consisting of hydrogen, methyl, ethyl, propyl, butyl and benzyl radicals and R" is selected from the group consisting of CH2OOC, and CH2OOC(CH2)4COO radicals.

These cycloaliphatic epoxy resins may be characterized by reference to their epoxy equivalent weight, which is defined as the weight of epoxide in grams which contains one gram equivalent of epoxy. Suitable cycloaliphatic epoxy resins have a preferred epoxy equivalent weight from about 50 to about 250. They will generally have a viscosity between about 5 to about 900 cp at 25 degrees C.

It is essential to the success of the present invention that the cycloaliphatic epoxide have a viscosity at 25 degrees C of no greater than bout 1000 centipoise, preferably about 300 to about 600 centipoise and most preferably about 300 to about 450 centipoise.

Examples of cycloaliphatic epoxides are suggested in U.S. Pat. No(s). 3,207,357; 2,890,194; 2,890,197; and 4,294,746, disclosures of which are incorporated herein by reference. Some specific examples of suitable cycloaliphatic epoxides are: 3,4-epoxycyclohexylmethyl-3,4-epoxycyclohexane carboxylate having the following structure:

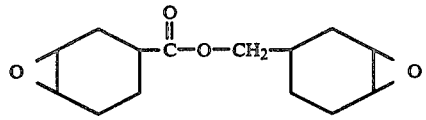

and available from the Union Carbide under the trade designation ERL-4221; bis (3,4-epoxycyclohexyl) adipate, having the following structure:

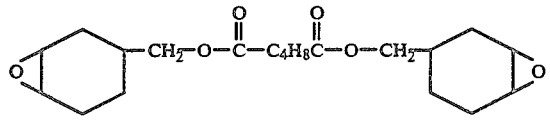

and available from Union Carbide under the trade designation ERL-4299; and vinyl cyclohexane diepoxide, having the following structure:

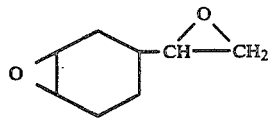

and available from Union Carbide under the trade designation ERL-4206.

A discussion of various cycloaliphatic epoxides can be found in the publication entitles "Cycloaliphatic Epoxide Systems", Union Carbide, 1970, disclosure of which is incorporated herein by reference. Mixtures of cycloaliphatic epoxides can be employed when desired. The preferred cycloaliphatic epoxide employed pursuant to the present invention is 3,4-epoxycyclohexylmethyl 3,4-epoxycyclohexane carboxylate (systematic name: 7-oxabicyclo (4.10) heptane-3-carboxylic acid 7-oxabicyclo (4.1)hept-3-ylmethyl ester).

Other suitable epoxy resins which can be incorporated in the present invention include, for example, those represented by the following formulas I-IV.

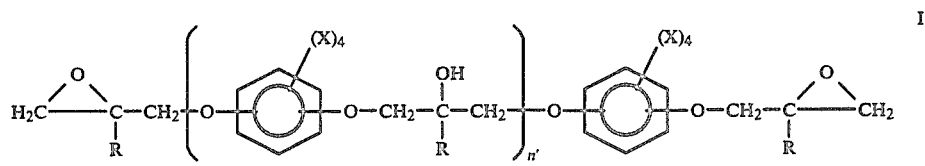

I.

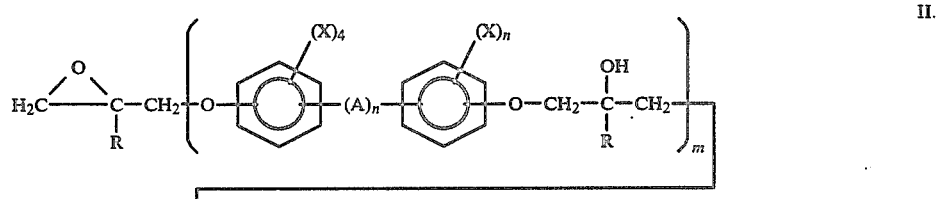

II.

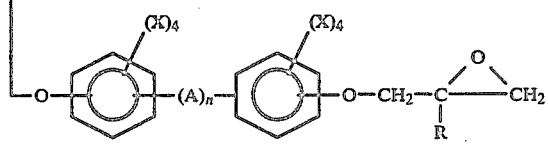

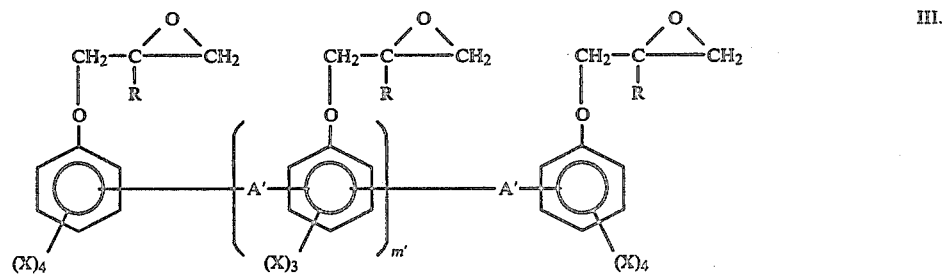

III.

-continued

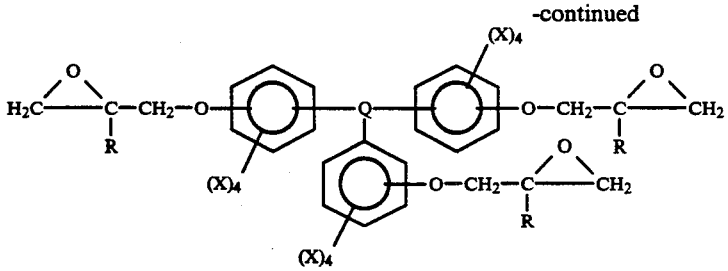

IV.

wherein each A independently a divalent hydrocarbyl group having from 1 to about 9, preferably from 1 to about 4, carbon atoms, -O-, -SO2-, or -CO-; each A' is independently a divalent hydrocarbyl group having from 1 to about 9, preferably from 1 to about 4 carbon atoms; Q is a hydrocarbyl group having from 1 to about 10 carbon atoms; Q' is hydrogen or an alkyl group having from 1 to about 4 carbon atoms; each X is independently hydrogen, bromine, chlorine, or a hydrocarbyl group having from 1 to about 9, preferably from 1 to about 4 carbon atoms; m has an average value from zero to about 12, preferably from about 0.03 to about 9, most preferably from about 0.03 to about 3; m' has a value from about 0.01 to about 10, preferably from about 8, more preferably from about 0.5 to about 6; n has a value of zero or 1; and n' has an average value from zero to about 10, preferably from zero to about 5, most preferably from about 0.1 to about 3.

Particularly suitable such epoxy resins include, for example, the diglycidyl ethers of resorcinol, catechol, hydroquinone, biphenol, bisphenol A, tetrabromobisphenol A, phenol-aldehyde novolac resins, alkyl substituted phenol-aldehyde resins, bisphenol F, tetramethylbiphenol, tetramethyltetrabrobiphenol, tetramethyltribromophenol, tetrachlorobisphenol A, combinations thereof and the like.

The cyanate esters that can be employed pursuant to the present invention have two or more —O—C≡N groups and are curable through cyclotrimerization. The cyanate esters can be monomeric or less preferably polymeric, including oligomers and can be represented by those materials containing the following group:

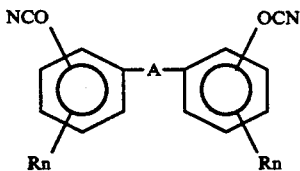

wherein A represents independently a single bond,

—SO2—, —O—, —C(CF3)2-, divalent alkylene radicals interrupted by heteroatoms in each chain such as O, S, and N. Each R is independently selected from the group of hydrogen, alkyl containing 1to 9 carbon atoms: Each n independently is an integer from 0 to 4. Specific cyanate esters that can be employed in the present invention are available and well-known and include those discussed in U.S. Pat. No(s). 4,195,132, 3,681,292, 4,740,584, 4,745,215, 4,477,629, and 4,546,131; European patent application EP0147548/82, and German Offen 2611796, disclosures of which are incorporated herein by reference.

An example of a suitable polyaromatic cyanate ester containing cycloaliphatic bridging group between aromatic rings is available from Dow Chemical Company under the designation "Dow XU-71787 00L cyanate. A discussion of such can be found in Bogan, et al., "Unique Polyaromatic Cyanate Ester for Low Dielectric Printed Circuit Boards", SAMPE Journal, Vol. 24, No. 6, Nov/Dec 1988. A preferred polyfunctional cyanate ester is Bisphenol AD dicyanate (4,4'-ethylidene bisphenol dicyanate) available from Hi-Tek Polymers under the trade designation Arocy L-10.

The compositions employed pursuant to the present invention also include a filler, and in particular an inorganic filler. The particle size of the filler must not be greater than 49 microns preferably about 0.7 to about 40 microns, and more preferably about 5 to about 30 microns, and most preferably about 10 microns. This size range is necessary so that the composition will readily flow in the 5 mil or less gap between the chip and substrate carrier.

In addition, the filler must be at least substantially free of alpha particle emissions produced from the trace amounts of radioactive impurities such as uranium and thorium normally present in conventional silica or quartz fillers. The fillers employed have emission rate of less than 0.01 alpha particles/cm2-hr and preferably less 0.005 alpha particles/cm2-hr. The presence of alpha-particle emissions primarily caused by the presence of uranium and thorium isotopes in the fillers can generate electron/hole pairs which in turn would be detrimental to the device. The preferred filler is high purity fused or amorphous silica such as commercially available DP4910 from PQ Corporation. The preferred filler can be optionally treated with coupling agent such as gamma amino propyl triethoxy silane (A1100) or Beta-(3,4-epoxy cyclohexyl) ethyltrimethoxy silane (A186) or gamma-glycidoxypropyltrimethoxy silane (Z6040) from Dow Corning. An amount of coupling agent which is about 0.25% by weight of filler has been found to be satisfactory. The amount was determined by weight loss of filler treated with coupler after burning. Although a range of concentration has not been established for the present formulation, it is suggested that an amount more than about a few monolayers would be adequate.

The compositions of the present invention contain about 25 to about 60% by weight and preferably about 50 to about 60% by weight of the binder, and correspondingly about 40 to about 75% by weight and preferably about 50 to about 60% by weight of the filler. These amounts are based upon the total amounts of binder and filler in the composition. When the binder includes the polyepoxide, the compositions employed in the present invention also include a hardening or curing agent. The preferred hardeners for the polyepoxides are the anhydrides of organic carboxylic acids. The hardening agent is preferably in liquid form. If a solid hardening agent is employed, such should be melted when added to the composition. Examples of anhydrides are methyl-tetrahydrophthalic anhydride, hexahydrophthalic anhydride, maleic anhydride, trimellitic anhydride, pyromellitic dianhydride, tetrahydrophthalic anhydride, phthalic anhydride, norbornenedicarboxylic anhydride, nadic methyl anhydride, and methylcyclohexane-1,2 dicarboxylic anhydride. Additional anhydrides can be found, for instance, in H. Lee and K. Neville, *Handbook of Epoxy Resin*, McGraw Hill, 1967, Chapter 12, disclosure of which is incorporated herein by reference.

The anhydride curing agent is generally employed in amounts constituting on an equivalent bases, about 20% to about 120% of the cycloaliphatic epoxide employed and preferably about 75% to about 100% of the epoxide equivalents.

Preferably the curing agent is employed in amounts of about 89 to about 110 parts by weight per hundred parts of polyepoxy (phr).

In addition to the binder and filler, the composition can also include a catalyst to promote the polymerization of the epoxy and/or cyanate ester.

Suitable catalysts for the epoxy include amines such as the tertiary amine benzyldimethylamine, 1,3-tetramethyl butane diamine, tris (dimethylaminomethyl) phenol, pyridine, and triethylenediamine and acidic catalysts such as stannous octoate.

Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper acetylacetonate or octoates or naphthenates. The amount of catalyst when use can vary, and generally will be 0.005 to 5 weight percent, preferably 0.05 to 0.5 weight percent based on total solid binder weight.

Surfactants in amounts of about 0.5% to about 3% and preferably about 1.2% to about 1.6% can be used to facilitate mixing the filler with the epoxy. Suitable surfactants include non-ionic type surface active agents such as Triton X-100 from Rohm and Haas Co.

These surface active agents are prepared by the reaction of octylphenol or nonylphenol with ethylene oxide and having the following general structural formula, respectively:

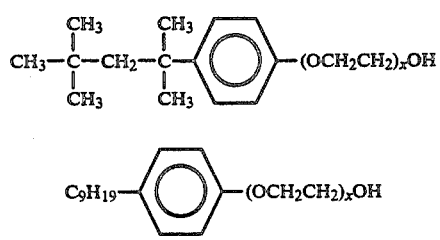

in which the C9 alkyl group is a mixture of branched-chain isomers and x is the average number of ethylene oxide nits in the ether side chain. Products of the above series of compounds include:

| | Octylphenol Series | |
|---|---|---|
| Triton | x-15 | x = 1 |
| Triton | x-35 | x = 3 |
| Triton | x-45 | x = 5 |
| Triton | x-114 | x = 7–8 |
| Triton | x-100 | x = 9–10 |
| Triton | x-102 | x = 12–13 |
| Triton | x-165 | x = 16 |
| Triton | x-305 | x = 30 |
| Triton | x-105 | x = 40 |
| Triton | x-705-50% | x = 70 |
| Triton | x-705-100% | x = 70 |
| | Nonylphenol Series | |
| Triton | n-17 | x = 1.5 |
| Triton | n-42 | x = 4 |
| Triton | x-57 | x = 5 |
| Triton | x-60 | x = 6 |
| Triton | x-87 | x = 8.5 |
| Triton | x-101 | x = 9–10 |
| Triton | x-111 | x = 11 |
| Triton | x-150 | x = 15 |
| Triton | x-101 | x = 40 |

In the compositions that employ a cycloaliphatic epoxide, it is preferred to also employ small amounts of a reactive modifier, a/k/a flexibilizer. The purpose of the reactive modifier is to impart desirable mechanical properties to the cured composition such as flexibility and thermal shock resistance. Examples of modifiers which can be used are fatty acids, fatty acid anhydrides such as polyazelaic poyanhydride and dodecenylsuccinic anhydride, diols such as ethylene glycol, polyols, polyetherdiols such as polyetylene glycol and polypropylene glycol, and other materials having dydroxyl groups, carboxyl, epoxy, and/or carboxylic anhydride functionality. One preferred reactive modifier is ethylene glycol which, when employed, is present in amounts of about 0.7 to about 2 phr (per hundred parts by weight of the epoxy). Ethylene glycol is employed as a source of hydroxyls to promote the reaction of anhydride with the epoxy.

It has been found that the preferred composition for crack-resistant encapsulant is the result of a mixture of the ethylene glycol as described above and about 5 to about 30%, preferably about 10% polyol flexibilizer. Polyol is a polyhydric alcohol, i.e., one containing three or more hydroxyl groups. The preferred polyol is one having a molecular weight between 700 and 6,000. Polyether polyols have given good results.

Examples of suitable polyols are Niax LHT-240, LHT-42 and LHT-28 having the formula :

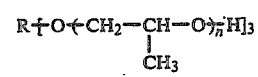

all from Union Carbide.

The preferred compositions employed pursuant to the present invention are substantially free (e.g. -less than 0.2% by weight) if not completely free of non-reactive organic solvents. Compositions employed pursuant to the present invention have viscosity at 25 degrees C as measured by Brookfield cone and plate Spindle 51, 20 RPM or equivalent of about 3,000 to about 17,000 centipoise and preferably about 3,000 to about 15,000 centipoise. The compositions are stable for at least 12 hours at room temperature. The compositions can be cured at temperatures of less than about 150 degrees C and preferably about 130 degrees C to about 140 degrees C in about 2 to about 6 hours, and preferably about 4 hours. The compositions when cured have alpha particle emissions of less than about 0.005 counts/cm2-hr, preferably less than about 0.004 counts/cm2-hr and most preferably less than about 0.002 counts/cm2-hr. The cured compositions also have coefficients of thermal expansion of about 22 ppm/C to about 35 ppm/C, glass transition temperatures (Tg) of greater than about 130 degrees C and preferably about 140 degrees C to about 160 degrees C. The cured compositions have Shore D hardness of greater than 85 and preferably greater than 90, modulus of elasticity at 25 degrees C of greater than 250,000 psi and preferably greater than 750,000 psi.

The compositions are prepared by rapidly admixing the components under vacuum, usually about 5 mm Hg, either using a double planetary mixer or high shear mixer to provide better and homogenous compositions.

The compositions are applied by dispensing through nozzles under pressure of about 15 psi to about 90 psi and temperatures of about 25 degrees C to about 40 degrees C. The compositions completely cover the C4 connections and pin heads. If desired, the compositions can be pregelled by heating for about 15 to about 60 minutes, typically about 30 minutes at about 65 degrees C to 75 degrees C.

The compositions are then cured by heating to about 130 degrees C to about 150 degrees C, and preferably about 130 degrees C to about 140 degrees C, for about 2 hours to about 6 hours, and preferably about 4 hours to about 5 hours. The chip carrier employed can be a flexible or rigid organic, inorganic or composite material. The preferred substrate can be a ceramic module or a multilayer printed circuit board. The preferred ceramic substrates include silicon oxides silicates such as aluminum silicate, and aluminum oxides.

The preferred printed circuit board includes conventional FR-4 Epoxy and laminates based on high temperature resins such as high temperature epoxies, polyimides, cyanates (triazines), fluoropolymers, ceramic filled fluoropolymers, benzocyclobutenes, perfluorobutanes, polyphenylenesulfide, polysulfones, polyetherimides, polyetherketones, polyphenylquinoxalines, polybenzoxazoles, and polyphenyl benzobisthiazoles, combinations thereof and the like.

Experiments were conducted in which formulations described above were prepared including also an organic dye, such as nigrosine or Orasol Blue GN available from Ciba-Geigy Corporation, in an amount less than 0.2%, in order to provide visual contrast. Flow under the chip was evaluated using transparent quartz chips. Flow under the quartz chips at room temperature was uniform, resulting in complete coverage of pin heads and solder balls, when filler was 58% by weight in the formulation and particle size was less than 30 microns.

In all the examples and tables to follow, the CTE's were measured using a Perkin-Elmer Thermomechanical Analyzer (TMA-7) on the expansion mode and employing 10mN force. The data reported are expansion between 0 and 100 degrees C.

The glass transition temperature was measured using a DuPont Differential Scanning Calorimeter, DSC 910, interfaced to a 9900 Thermal Analyzer. The glass transition temperature was recorded as the onset of the endothermic baseline deflection. Tensile strength of these samples was measured using an Instron 1321 Servohydraulic Bi-axial machine at room temperature and strain rate $5.5\times 10-4$/sec. Three to five samples were used as an average for each formulation. The percent elongation was calculated from the maximum displacement divided by the gage length. Improved elongations to break are obtained with the addition of polyols in the system.

The following non-limiting examples are presented to further illustrate the present invention.

EXAMPLE 1

This example describes the compositions prepared by the incorporation of the polyol reactive modifier in the main binder. Details are as follows. A composition containing about 50 parts by weight of 3,4-epoxycyclohexylmethyl-3,4-epoxycyclohexane carboxylate (Union Carbide ERL-4221), about 50 parts by weight of hexahydrophthalic anhydride; about 0.5 parts by weight of benzyl dimethyl amine, about 0.1 part by weight of ethylene glycol, about 3.15 parts by weight of Triton X-100 surfactant from Rohm & Haas and about 0.08 parts by weight of nigrosine was prepared. This composition is identified as A and was used in combination with the polyols to make compositions described in the subsequent examples. Sufficient amount of this composition was prepared in order to make specimens for testing the mechanical properties shown in Table I under the designation A.

TABLE I

| Properties | Compositions | | | | |
|---|---|---|---|---|---|
| | A | A1 | A2 | A3 | A4 |
| Tensile Strength (psi) | 9900 | 8800 | 9400 | 8700 | — |
| Percent Elongation (%) | 2.5 | 2.4 | 3.5 | 3.8 | 3.9 |
| Thermal Expansion ppm/C. (0–100 degrees C.) | 65 | 73 | 76 | 72 | 85 |
| Glass Transition Temperature (degrees C.) | 145 | 145 | 140 | 95 | 105 |

EXAMPLE 2

Compositions containing 22 parts by weight of A in each case, and about 0.536, 1.13, 2.54 and 4.36 parts by weight of Niax LHT 240 were thoroughly mixed to produce compositions A1 through A4 respectively. Sufficient quantity from each of these compositions was poured into a 4 inch by 6 inch and 60 mils thick mold to make specimens for measurement of mechanical properties. The samples were cured at 130 degrees C for about 4 hours, cooled down to room temperature and cut into half inch by 5 inch flexural specimens and tested. Results of the mechanical testing are given in Table I.

EXAMPLE 3

Compositions containing 19 parts by weight of A in each case, and about 0.456, 0.914, 2.2 and 3.5 parts by weight of Niax LHT 42 were thoroughly mixed to produce compositions A5 trough A8 respectively. Sufficient quantity from each of these compositions was poured into a 4 inch by 6 inch and 60 mils thick mold to make samples for the measurement of mechanical properties. The samples were cured at 130 degrees C for about 4 house, cooled down to room temperature and cut into half inch by 5 inch flexural specimens and tested. Results of the mechanical testing are given in Table II.

TABLE II

| Properties | Compositions | | | |
|---|---|---|---|---|
| | A5 | A6 | A7 | A8 |
| Tensile Strength (psi) | 8300 31 | 1100 | 8600 | 6900 |
| Percent Elongation (%) | 2.7 35 | 4.7 | 6.6 | 4.5 |
| Thermal Expansion ppm/C. (0-100 degrees C.) | 69 | 80 | 95 | — |
| Glass Transition Temperature (degrees C.) | 146 | 148 | 136 | 135 |

EXAMPLE 4

Compositions containing 15 parts by weight in each case and about 0.366, 0.773, and 1.73 parts by weight, respectively, of Niax LHT 28 were prepared by thoroughly mixing and casting into a 4 inch by 6 inch by 60 mils thick mold to produce specimens for measurements of mechanical properties. These compositions are identified as A9 through A11. The specimens were cured at 130 degrees C for about 4 hours cooled to room temperature and cut into half inch by five inch flexural bars. Results are presented in Table III.

TABLE III

| Properties | Compositions | | |
|---|---|---|---|
| | A9 | A10 | A11 |
| Tensile Strength (psi) | 9800 35 | 9500 | 8200 |
| Percent Elongation (%) | 2.9 39 | 3.7 | 8.4 |
| Thermal Expansion ppm/C. (0-100 degrees C.) | 68 | 77 | 91 |
| Glass Transition Temperature (degrees C.) | 150 | 152 | 140 |

EXAMPLE 5

About 11.6 parts by weight of fused silica available under the trade designation DP4910 from PQ Corporation, having a particle size of 49 microns maximum and being substantially free of alpha particle emissions were thoroughly mixed with 8.4 parts by weight of composition A6. The mixture was desired in a vacuum dessicator at 25 in. Hg and stored in a freezer at −20 degrees C. Viscosity was measured to be 12,000 cps at 25 degrees C and did not change after storing the composition at −70 degrees C for up to 2.5 months of testing. This composition was used as an example to illustrate the fatigue life enhancement of the solder connections due to encapsulation and the crack-free performance of the compositions as represented in FIG. 3.

The compositions were dispensed at a temperature of about 30 degrees C into a gap of about 5 mils between a silicon chip soldered by solder bumps to a 8mm by 28mm A1203 substrate having pins protruding therefrom. The compositions were cured at about 130 degrees C in about 4 hours. The cured compositions had coefficients of thermal expansion of less than 30 ppm/degrees The compositions covered pin heads and surrounded the solder bumps.

The structures tested for fatigue life exhibited no failures when thermocycling for over 5000 cycles between 0-100 degrees C. On the other hand control parts filled with prior art compositions show failures at about 2000 cycles.

It is understood that the invention may be embodied in modifications of the present invention without departing from the spirit or central characteristics thereof. The aforementioned examples and embodiments are therefore to be considered in all respects as illustrative rather than restrictive, and the invention is not to be limited to the details given therein.

What is claimed is:

1. A solder interconnection for forming connections between a circuitized device and a carrier substrate comprising a plurality of solder connections that extend from the carrier substrate to electrodes on the circuitized device to form a gap between carrier substrate and the circuitized device, wherein the gap is filled with a composition obtained from curing a composition containing:
   A. a cycloaliphatic polyepoxide binder having a viscosity at room temperature of no greater than about 1,000 centipoise;
   B. an organic carboxylic acid anhydride hardener, said hardener being present in an amount of 20 to 120 carboxylic equivalents per 100 epoxide equivalents;
   C. a glycol source of hydroxyls to promote reaction between the cycloaliphatic polyepoxide and the organic carboxylic acid anhdyride, said glycol being present in an amount of 0.7 to 2 parts per 100 parts of cycloaliphatic polyepoxide;
   D. a filler having a maximum particle size of about 49 microns and being substantially free of alpha particle emissions, said filler being present in an amount of 40 to 75 weight percent basis total filler and cycloaliphatic polyepoxide binder;
   E. a surfactant in an amount between about 1% and about 1.4%; and
   F. a polyol flexibilizer, said polyol flexibilizer being present in amount from 5 to 30 weight percent of the cycloaliphatic epoxide binder.

2. The solder interconnection of claim 1 wherein the cycloaliphatic polyepoxide binder is selected from the group consisting of 3,4-epoxycyclohexylmethyl-3,4-epoxycyclohexane carboxylate and vinyl cyclohexane diepoxide.

3. The solder interconnection of claim 2 wherein the cycloaliphatic polyepoxide binder is 3,4-epoxycyclohexylmetyl-3,4-epoxycyclohexane carboxylate.

4. The solder interconnection of claim 1 wherein the organic carboxylic acid anhydride hardener is selected from the group consisting of hexahydrophthalic anhydride, methyl hexahydrophthalic anhydride, and mixtures thereof.

5. A composition comprising:
   A. a cycloaliphatic polyepoxide binder having a viscosity at room temperature of no greater than about 1,000 centipoise;
   B. an organic carboxylic acid anhydride hardener, said hardener being present in an amount of 20 to 120 carboxylic equivalents per 100 epoxide equivalents;
   C. a glycol source of hydroxyls to promote reaction between the cycloaliphatic polyepoxide and the organic carboxylic acid anhdyride, said glycol being present in an amount of 0.7 to 2 parts per 100 parts of cycloaliphatic polyepoxide;
   D. a filler having a maximum particle size of about 49 microns and being substantially free of alpha particle emissions, said filler being present in an amount of 40 to 75 weight percent basis total filler and cycloaliphatic polyepoxide binder;

E. a surfactant in an amount between about 1% and about 1.4%; and

F. a polyol flexibilizer, said polyol flexibilizer being present in amount from 5 to 30 weight percent of the cycloaliphatic epoxide binder.

6. The solder interconnection of claim 5 wherein the cycloaliphatic polyepoxide binder is selected from the group consisting of 3,4-epoxycyclohexylmethyl-3,4-epoxycyclohexane carboxylate and vinyl cyclohexane diepoxide.

7. The solder interconnection of claim 6 wherein the cycloaliphatic polyepoxide binder is 3,4-epoxycyclohexylmethyl-3,4-epoxycyclohexane carboxylate.

8. The solder interconnection of claim 5 wherein the organic carboxylic acid anhydride hardener is selected from the group consisting of hexahydrophthalic anhydride, methyl hexahydrophthalic anhydride, and mixtures thereof.

* * * * *